United States Patent
Chang et al.

(10) Patent No.: US 9,077,173 B2
(45) Date of Patent: Jul. 7, 2015

(54) COMMON MODE FILTER

(71) Applicant: Samsung Electro-Mechanics Co., Ltd., Suwon-si, Gyeonggi-do (KR)

(72) Inventors: Geon Se Chang, Suwon-si (KR); Sung Kwon Wi, Suwon-si (KR)

(73) Assignee: SAMSUNG ELECTRO-MECHANICS CO., LTD., Suwon, Gyeonggi-Do (KR)

( * ) Notice: Subject to any disclaimer, the term of this patent is extended or adjusted under 35 U.S.C. 154(b) by 28 days.

(21) Appl. No.: 14/098,291

(22) Filed: Dec. 5, 2013

(65) Prior Publication Data

US 2014/0160610 A1 Jun. 12, 2014

(30) Foreign Application Priority Data

Dec. 10, 2012 (KR) .................. 10-2012-0142819

(51) Int. Cl.
  *H02H 1/00* (2006.01)
  *H02H 9/04* (2006.01)
  *H01L 23/60* (2006.01)
  *H03H 7/42* (2006.01)

(52) U.S. Cl.
  CPC ............... *H02H 9/04* (2013.01); *H03H 7/427* (2013.01); *H01L 23/60* (2013.01)

(58) Field of Classification Search
  USPC ................................. 361/117–119
  See application file for complete search history.

(56) References Cited

U.S. PATENT DOCUMENTS

2010/0157501 A1* 6/2010 Asakura et al. ............... 361/112
2011/0007439 A1* 1/2011 Asakawa et al. ............... 361/56

FOREIGN PATENT DOCUMENTS

KR  10-2008-0092155 A  10/2008
KR  10-2010-0037000 A  4/2010

* cited by examiner

*Primary Examiner* — Danny Nguyen
(74) *Attorney, Agent, or Firm* — McDermott Will & Emery LLP

(57) ABSTRACT

Disclosed herein is a common mode filter. The common mode filter includes a main body that includes a coil electrode, first and second external electrodes connected with both ends of the coil electrode, respectively, and a ground electrode, and an electro static discharge (ESD) protection layer that includes a switching member formed therein, and is provided on any one surface of the main body. Here, one end of the coil electrode is connected with the second external electrode, the other end thereof is connected with the first external electrode through the switching member, and the switching member is disconnected from the coil electrode in accordance with a switching operation when a surge current is applied and connected with the ground electrode. Therefore, it is possible to protect the common mode filter from a surge current by ESD.

21 Claims, 4 Drawing Sheets

COMMON MODE FILTER

CROSS REFERENCE(S) TO RELATED APPLICATIONS

This application claims the benefit under 35 U.S.C. Section 119 of Korean Patent Application Serial No. 10-2012-0142819, entitled "Common Mode Filter" filed on Dec. 10, 2012, which is hereby incorporated by reference in its entirety into this application.

BACKGROUND OF THE INVENTION

1. Technical Field

The present invention relates to a common mode filter, and more particularly, to a common mode filter, in which electro static discharge (ESD) protection function is provided.

2. Description of the Related Art

With the development in technologies, electronic apparatuses such as mobile phones, home appliances, personal computers (PC), personal digital assistants (PDA), liquid crystal displays (LCD), and the like have changed from an analog scheme to a digital scheme, and have been speeded up due to an increase in the amount of data to be handled. Therefore, USB 2.0, USB 3.0, and a high-definition multimedia interface (HDMI) have been commonly used as a high signal transmission interface, and have been used in many digital devices such as PCs or digital high-definition televisions.

These interfaces adopt a differential signal system for transmitting differential signals (differential mode signals) using a pair of signal lines unlike a single-end transmission system that has been typically used for a long time. However, electronic apparatuses which have been digitalized and speeded up are sensitive to external stimulation. That is, when a slightly abnormal voltage and high frequency noise flow into an internal circuit of the electronic apparatus from the outside, the circuit may be damaged or signals may be distorted.

In this instance, as the causes of the abnormal voltage and noise that cause damage of the circuit of the electronic apparatus and occurrence of signal distortion, lighting, discharge of static electricity charged on a human body, switching voltage generated within the circuit, power supply noise included in a power supply voltage, unnecessary electromagnetic signals or noise, and the like may be given. In this manner, in order to prevent the damage of the circuit of the electronic apparatus and occurrence of the signal distortion, a filter is provided to prevent the abnormal voltage and high-frequency noise from flowing in the circuit.

In general, a common mode filter is used in a high-speed differential signal line or the like in order to eliminate common mode noise. The common mode noise is noise generated in the differential signal line, and the common mode filter eliminates noises that cannot be eliminated by an existing EMI filter. The common mode filter contributes to the improvement in EMC characteristics of home appliances or the like or improvement in antenna characteristics of a mobile phone or the like.

However, in the recent high-speed digital interface, since the interface handles minute signals transmitted at a high speed, an integrated circuit (IC) that is significantly sensitive to electro static discharge (hereinafter, referred to as "ESD") generated at the time of connection and disconnection between different elements should be used.

In order to prevent damage of the IC by ESD, a varistor may be used as a device for coping with the ESD between a signal line and a base. However, when the varistor is used, a signal waveform is deactivated, and signal quality is deteriorated. Therefore, a lower capacity-device for coping with ESD is required.

For example, in Korean Patent Laid-Open Publication No. 10-2010-0037000, a structure in which a lead wire connected with an external electrode is spaced apart from a ground electrode for eliminating ESD (hereinafter, referred to as "ground electrode") by a significantly small interval is used. This interval is generally constituted of a dielectric, and a peak voltage may vary depending on a dielectric constant and thickness of a dielectric layer. Using this, in a normal operating state without ESD, resistance between the ground electrode and the lead wire has an infinite size by this interval, so that current are not conducted therebetween, and a noise filtering function is exhibited.

Unlike this, when a surge current flows due to generation of ESD, ESD may cause an electron tunneling phenomenon so that a space between the ground electrode and the lead wire may be changed so as to have conductivity. Accordingly, ESD flows to the ground electrode in which a current flow path is relatively short compared to a coil electrode, thereby protecting the coil electrode from the ESD.

However, in this structure, the dielectric layer itself serving as ESD protection function may be destroyed depending on a size of the surge current. In addition, even if the surge current flow to the ground electrode, a portion shared in a movement path of current may exist, so that the risk of occurrence of malfunction may be always inherent, whereby the surge current may flow to the coil electrode. Consequently, this may cause a problem such as a reduction in reliability in a product.

RELATED ART DOCUMENT

Patent Document (Patent Document 1) Korean Paten Laid-Open Publication No. 10-2010-0037000

SUMMARY OF THE INVENTION

An object of the present invention is to provide a common mode filter which may change an inner connection structure so as to fundamentally prevent a surge current from flowing to a coil electrode when the surge current flows, thereby ensuring reliability.

According to an embodiment of the present invention, there is provided a common mode filter including: a main body that includes a coil electrode, first and second external electrodes connected with both ends of the coil electrode, respectively, and a ground electrode; and an ESD protection layer that includes a switching member formed therein, and is provided on any one surface of the main body, wherein one end of the coil electrode is connected with the second external electrode, the other end thereof is connected with the first external electrode through the switching member, and the switching member is disconnected from the coil electrode in accordance with a switching operation when a surge current is applied and connected with the ground electrode.

According to another embodiment of the present invention, there is provided a common mode filter including: a main body that includes a coil electrode, first and second external electrodes connected with both ends of the coil electrode, and a ground electrode; and an ESD protection layer that includes a switching member formed therein and is provided on any one surface of the main body, wherein the first external electrode is connected with the switching member through a first lead wire extending from the first external electrode, one end of the coil electrode is connected with the second external electrode through a via, the other end thereof is connected with the switching member through a second lead wire extending from the other end thereof, and the switching member is disconnected from the second lead wire in accordance with a switching operation when a surge current is applied and connected with the ground electrode through a third lead wire extending from the ground electrode.

In addition, the ESD protection layer may include a permanent magnetic body that forms a magnetic field around the switching member.

Besides, the permanent magnetic body may be disposed so as to be parallel to the switching member.

Further, the first to third lead wires may be buried in an inner wall of the ESD protection layer.

Furthermore, both ends of the switching member may be provided so as to be fixed on a support portion protruding to an empty space inside the ESD protection layer.

Moreover, an end of the first lead wire may be buried in any one of the support portions that fix both ends of the switching member to thereby be connected with the switching member.

Also, the switching member may include a conductive magnetic film in which distortion occurs when the surge current is applied, a signal line that connects both ends of the conductive magnetic film, a polymer elastic body that wraps the conductive magnetic film and the signal line, and a protrusion terminal that is formed on upper and lower portions of the polymer elastic body, and passes through the polymer elastic body so as to be connected with the signal line.

In addition, an end of the first lead wire may be connected with the signal line.

In addition, an end of the second lead wire may be constituted of a terminal that protrudes to an empty space inside the ESD protection layer, and the terminal may be brought into contact with an end of the second lead wire.

In addition, an end of the third lead wire may be constituted of a terminal that protrudes to an empty space inside the ESD protection layer, and the terminal may be brought into contact with an end of the third lead wire when the surge current is applied.

In addition, the main body may include an insulating layer that buries the coil electrode, the first and second external electrodes and the ground electrode formed on the insulating layer, and a magnetic composite that is formed between the first and second external electrodes and the ground electrode.

In addition, the main body and the ESD protection layer, or the ESD protection layer and the main body may be sequentially provided on a magnetic body substrate.

DESCRIPTION OF THE PREFERRED EMBODIMENTS

Advantages and characteristics of the present invention, and a method for achieving them will be apparent with reference to embodiments described below in addition to the accompanying drawings. However, the present invention is not limited to the embodiments disclosed below, but may be implemented in various forms. The embodiments may be provided to completely disclose the present invention and allow those skilled in the art to completely know the scope of the present invention.

Terminologies used in the present specification are used to describe embodiments, and are not intended to limit the present invention. In the present specification, the singular form may include the plural form unless specifically mentioned. "Comprise" and/or "comprising" used in the specification do not exclude mentioned components, steps, actions, and/or presence or addition of elements.

Figure 1:
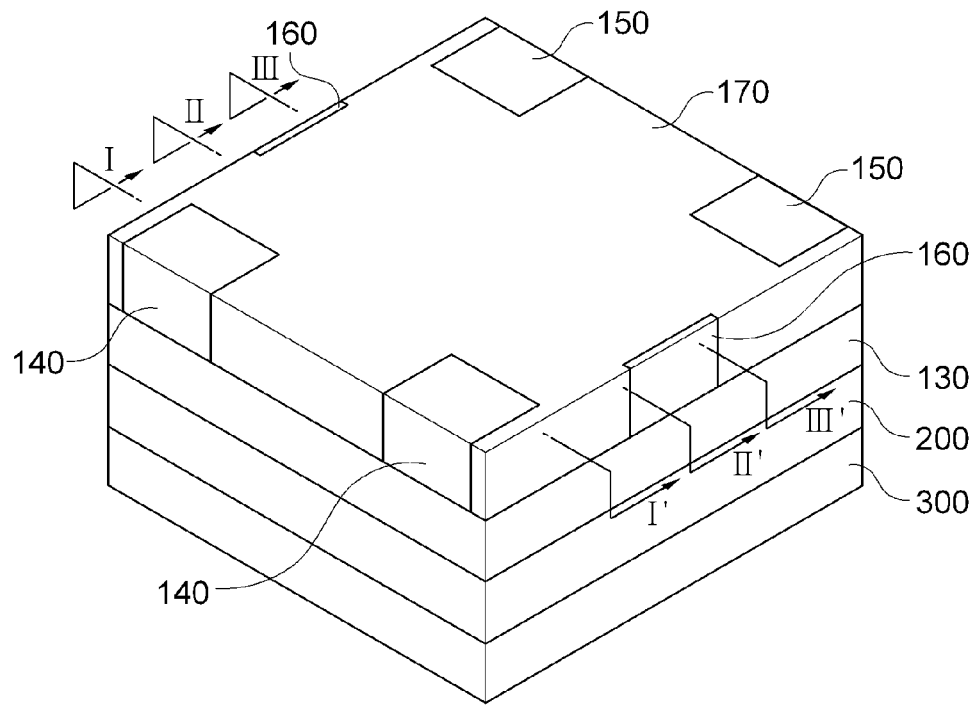
FIG. 1 is a perspective view showing a common mode filter according to an embodiment of the present invention.
Figure 2:
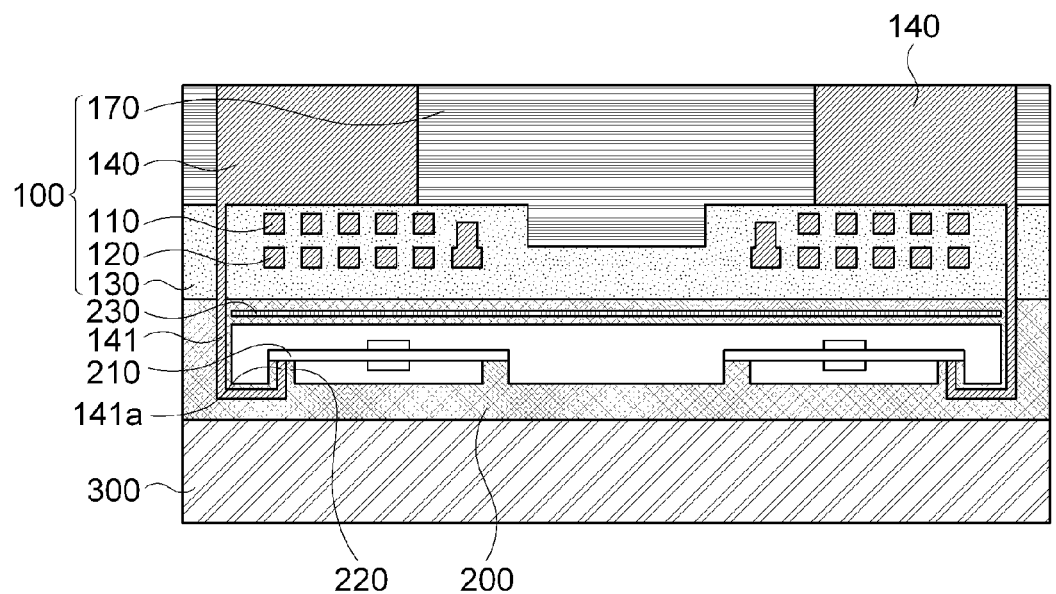
FIG. 2 is a cross-sectional view taken along an I-I' line of FIG. 1.
Figure 3:
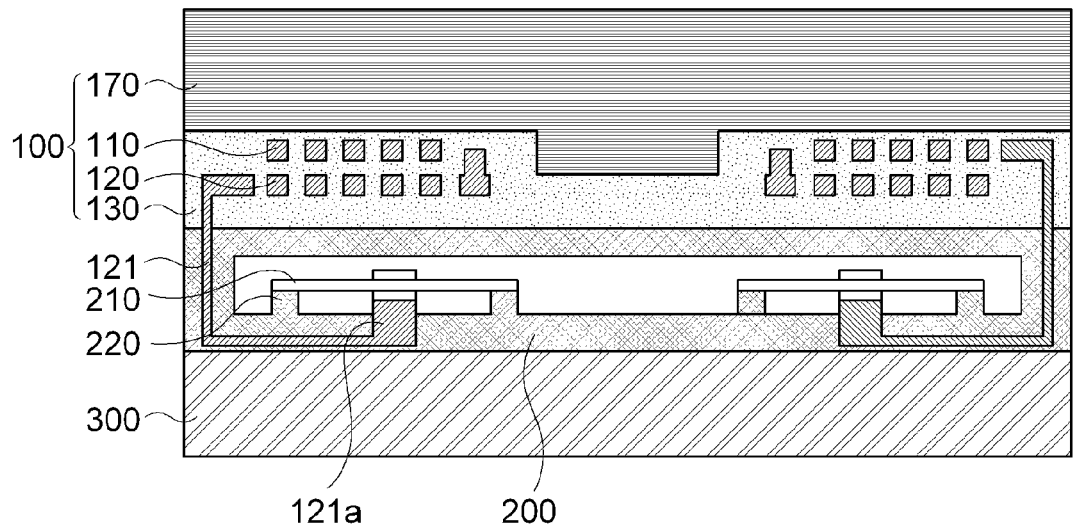
FIG. 3 is a cross-sectional view taken along an II-II' line of FIG. 1.
Figure 4:
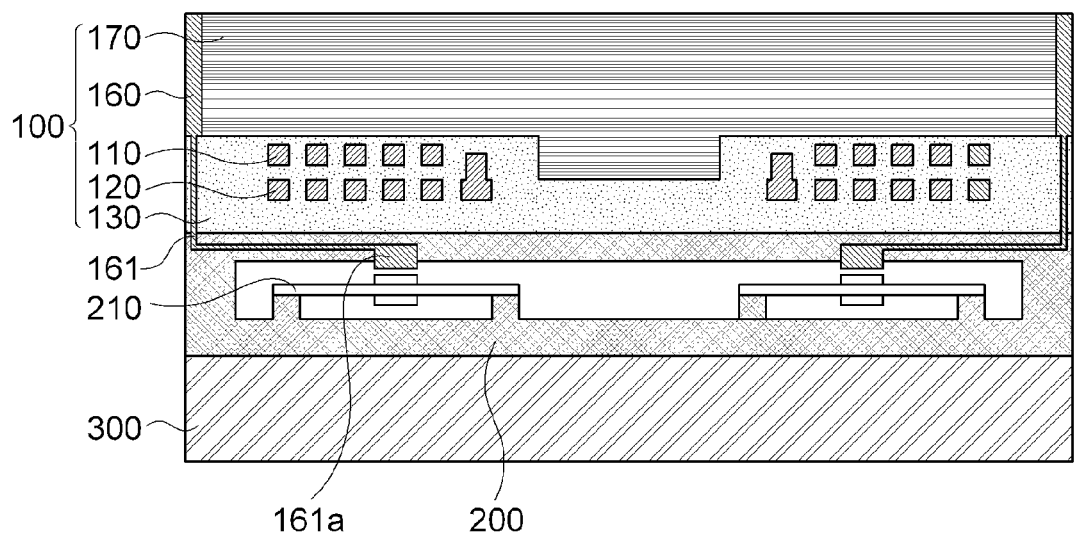
FIG. 4 is a cross-sectional view taken along an III-III' line of FIG. 1.
Figure 5:
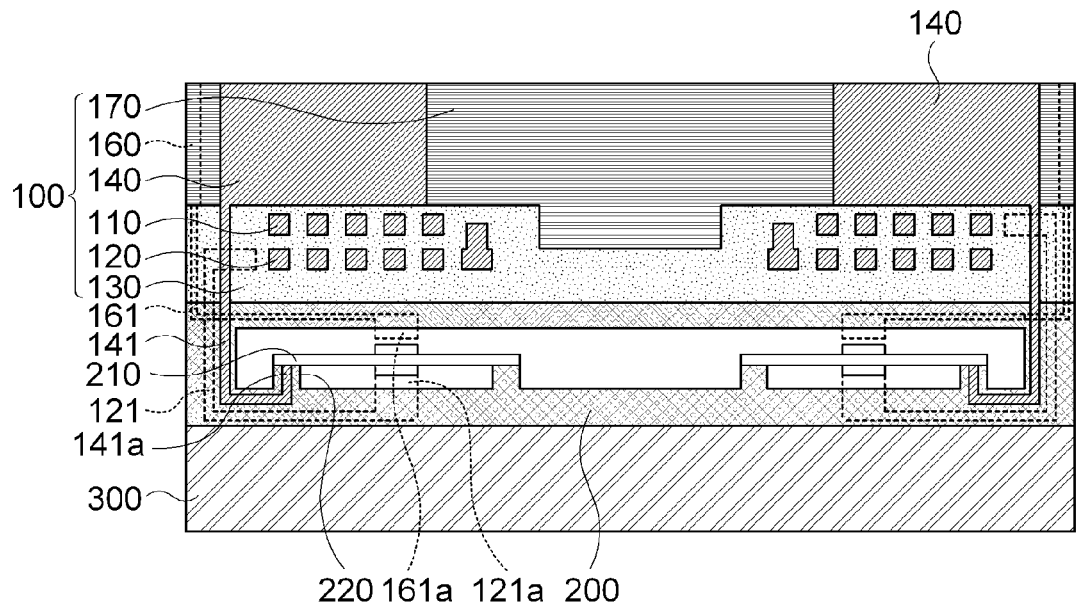
FIG. 5 is a cross-sectional view obtained by projecting FIGS. 3 and 4 with respect to FIG. 2.

FIG. 1 is a perspective view showing a common mode filter according to an embodiment of the present invention, FIG. 2 is a cross-sectional view taken along an I-I' line of FIG. 1, FIG. 3 is a cross-sectional view taken along an II-II' line of FIG. 1, FIG. 4 is a cross-sectional view taken along an III-III' line of FIG. 1, and FIG. 5 is a cross-sectional view obtained by projecting FIGS. 3 and 4 with respect to FIG. 2. In addition, components of the drawings are not necessarily drawn to scale, and for example, to help the understanding of the present invention, the component size of some of the components may be exaggerated compared to the other components. Meanwhile, the same reference numerals displayed on each of the drawings may refer to the same components. In addition, for the simplication and clarification of the drawing, the drawings show general configuration method, and detailed descriptions of characteristics and technologies which are well known will be omitted to avoid discussions of the described embodiments of the present invention from being made unnecessarily obscure.

Referring to FIGS. 1 to 5, a common mode filter according to an embodiment of the present invention may include a main body 100 including coil electrodes 110 and 120, first and second external electrodes 140 and 150, and a ground electrode 160, and an ESD protection layer 200 provided on any one surface of the main body 100. Here, in order to smoothen the flow of a magnetic flux generated in the coil electrodes 110 and 120, a magnetic body substrate 300 may be provided below the coil electrodes 110 and 120. The ESD protection layer 200 may be provided on a top surface or a bottom surface of the main body 100, and in FIGS. 1 to 5, an example in which a common mode filter is positioned on the bottom surface of the main body 100 is shown.

More specifically, the structure of the main body 100 will be described. The main body 100 may include an insulating layer 130 that buries the coil electrodes 110 and 120, the first and second external electrodes 140 and 150 and the ground electrode 160 which are formed on the insulating layer 130, and a magnetic composite 170 that is formed between the first and second external electrodes 140 and 150 and the ground electrode 160.

Here, the coil electrodes 110 and 120 may be a pair of upper coil electrode 110 and lower coil electrode 120 which are spaced apart from each other by a predetermined interval so as to be electromagnetically coupled to each other. Accordingly, the common mode filter according to an embodiment of the present invention may include first and second external electrodes 140 and 150 which are electrically connected with both ends of the lower coil electrode 120, and first and second external electrodes which are electrically connected with both ends of the upper coil electrode 110. However, for convenience of description, the coil electrode which will be described below may denote the lower coil electrode 120, and description thereof will be made based on a connection structure between the lower coil electrode 120 and each of the first and second external electrodes 140 and 150, the ground electrode 160, and the ESD protection layer 200. However, the following description may be applied to the upper coil electrode 110 in the same manner.

The coil electrode 120 may be spirally plated on the same plane, so that a hollow portion may be formed in a position corresponding to an inner center of the coil electrode 120. Here, in the common mode filter according to an embodiment of the present invention, the magnetic composite 170 may be filled inside the hollow portion in order to more improve impedance characteristics.

A switching member 210 may be provided inside the ESD protection layer 200, so that one end of the coil electrode 120 may be connected with the second external electrode 150, and the other end thereof may be connected with the first external electrode 140 through the switching member 210.

More specifically, the above-described structure will be described with reference to drawings. The first external electrode 140 may be connected with one end of the switching member 210 through a first lead wire 141 extending from the first external electrode 140. One end of the coil electrode 120 may be connected with the second external electrode 150 through a via (not shown), and the other end thereof may be connected with the switching member 210 through a second lead wire 121 extending from the other end of the coil electrode 120.

Specifically, one end of the switching member 210 may be connected with an end 141a of the first lead wire 141 extending from the first external electrode 140, and the switching member 210 may be connected with an end 121a of the second lead wire 121 extending from the other end of the coil electrode 120.

Accordingly, the coil electrode 120 whose end is directly connected with the second external electrode 150 through the via (not shown may be electrically connected with the first external electrode 140 through the second lead wire 121 extending from the other end of the coil electrode 120, the switching member 210 whose specific portion (specifically, a center portion) is connected with the end 121a of the second lead wire 121, and the first lead wire 141 whose end 141a is connected with the one end of the switching member 210.

According to this structure, a current (hereinafter, referred to as "signal current") by normal signals input from the first external electrode 140 may flow in the switching member 210 through the first lead wire 141, and the flowing-in current may flow again inside the coil electrode 120 through the second lead wire 121.

Figure 6:
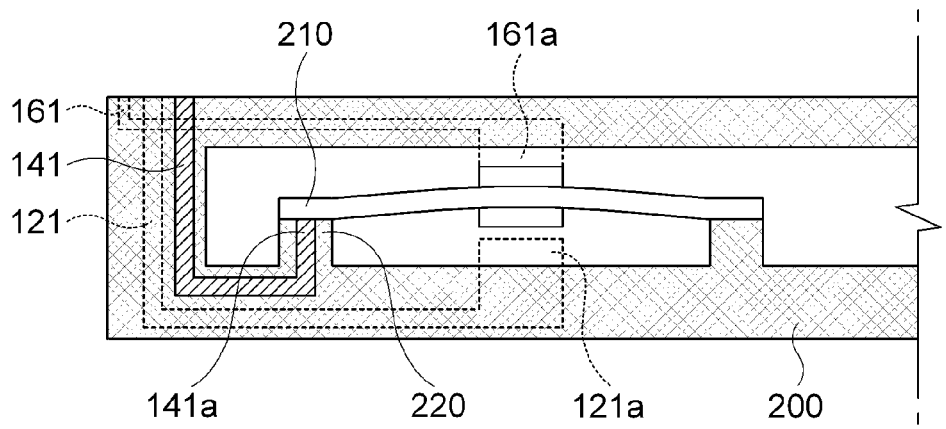
FIG. 6 is a drawing for describing an operating state of a switching member when a surge current is applied according to an embodiment of the present invention.

FIG. 6 is a drawing for describing an operating state of the switching member 210 when a surge current is applied, and is obtained by projecting cross-sections of FIGS. 3 and 4 with respect to the cross-section of FIG. 2 and then enlarging only the ESD protection layer 200.

Referring to FIGS. 1 to 6, an inner structure of the common mode filter according to an embodiment of the present invention which is converted when a surge current is applied will be described. When a surge current is applied to the first external electrode 140 by electro static discharge (ESD), the switching member 210 may be disconnected from the coil electrode 120 in accordance with a switching operation, and connected with the ground electrode 160.

More specifically, when the surge current is applied, the ground electrode 160 may be connected with the switching member 210 through a third lead wire 161 extending from the ground electrode 160.

That is, an end 161a of the third lead wire 161 may be positioned in the vicinity of the switching member 210, so that when the surge current is applied, a specific portion (specifically, a center portion) of the switching member 210 may be disconnected from the end 121a of the second lead wire 121 and connected with the end 161a of the third lead wire 161 to thereby be electrically connected with the ground electrode 160. The switching operation of the switching member 210 will be described below.

Hereinafter, an inner structure of the ESD protection layer 200 will be described in detail.

The inside of the ESD protection layer 200 forms an empty space, and an inner wall thereof may be made of an insulating material, for example, ceramic. Each lead wire extending from each of the electrodes may be buried in the inner wall of the ESD protection layer 200.

For example, the first lead wire 141 may pass through the insulating layer 130 to be buried in the inner wall of the ESD protection layer 200. This is a structure exhibited when the first external electrode 140 is formed on a top surface of the insulating layer 130 and the ESD protection layer 200 is positioned below the insulating layer 130 as in the example of the present invention, and therefore, when the first external electrode 140 is positioned on a side surface of the insulating layer 130 or the ESD protection layer 200 is positioned above the insulating layer 130 unlike the example shown in drawings, the first lead wire 141 may be buried in the inner wall of the ESD protection layer 200 without passing through the insulating layer 130.

The second lead wire 121 may extend from the coil electrode 120 provided inside the insulating layer 130 to thereby pass through the insulating layer 130 and be buried in the inner wall of the ESD protection layer 200, and the third lead wire 161 may pass through the insulating layer 130 to be buried in the inner wall of the ESD protection layer 200 in the same manner as in the first lead wire 141.

Both ends of the switching member 210 may be fixed on a support portion 220 protruding to an empty space inside the ESD protection layer 200, and may be positioned and provided at a predetermined height within the empty space inside the ESD protection layer 200, that is, a height corresponding to a thickness of the support portion 220.

The support portion 220 may be made of an insulating material, specifically, a ceramic material so as to be integrally formed with the ESD protection layer 200. According to this structure, the end 141a of the first lead wire 141 may be buried in any inner portion of the support portion 220 to thereby be connected with the switching member 210.

Figure 7:
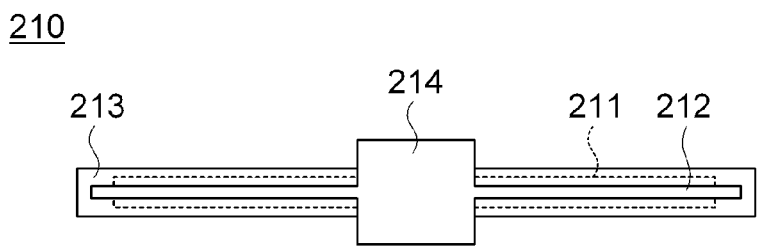
FIG. 7 is a cross-sectional view showing a switching member according to an embodiment of the present invention.
Figure 8:
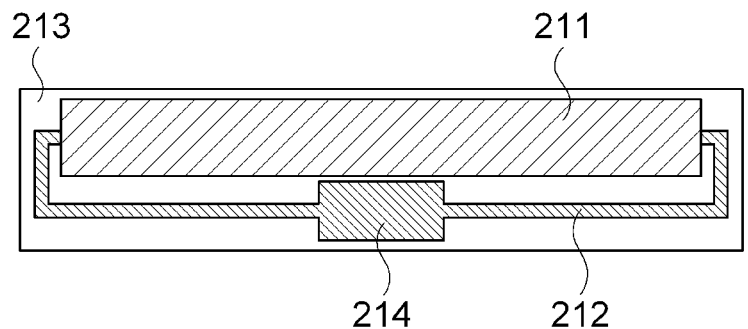
FIG. 8 is a transverse cross-sectional view showing a switching member according to an embodiment of the present invention.

FIG. 7 is a cross-sectional view showing the switching member 210, and FIG. 8 is a transverse cross-sectional view showing the switching member 210. Referring to FIGS. 7 and 8, the structure of the switching member 210 will be described in more detail.

The switching member 210 may include a conductive magnetic film 211, a signal line 212 connecting both ends of the conductive magnetic film 211, and a polymer elastic body 213 wrapping the conductive magnetic film 211 and the signal line 212.

The conductive magnetic film 211 may be made of a magnetic material such as nickel (Ni), iron (Fe), cobalt (Co), or the like, so that distortion having a predetermined curvature may vertically occur when a surge current is applied.

Such an operation of the conductive magnetic film 211 is exhibited using an electromagnetic force principle that occurs when current flows in a conductor within a magnetic field, and the ESD protection layer 200 may include a permanent magnetic body (230 of FIG. 2) that forms a magnetic field around the conductive magnetic film 211. A magnitude of the electromagnetic force may be the largest when an angle between the conductor and the magnetic field is 90 degrees, and therefore the permanent magnetic body 230 may be buried in the inner wall of the ESD protection layer 200 in such a manner as to be disposed so as to be parallel to the switching member 210.

The switching operation of the switching member will be described in detail. When a surge current by ESD flows-in from the first external electrode in a state in which a magnetic field is formed around the conductive magnetic film 211 by the permanent magnetic body 230, an electromagnetic force is applied to the conductive magnetic film from below to above, and therefore the conductive magnetic film is bent upwardly. According to this, the polymer elastic body having a predetermined elastic force may be also bent, and consequently, the specific portion (specifically, the center portion) of the switching member may be disconnected from the second lead wire 121 and connected with the end 161a of the third lead wire 161, as shown in FIG. 6.

Meanwhile, a size of a driving current of the conductive magnetic film 211 may vary depending on a thickness, a length, and a width of the conductive magnetic film 211, and a type or a mixing ratio of magnetic constituents, and therefore it is preferable that the driving current of the conductive magnetic film 211 be designed by appropriately adjusting these in accordance with a type of the common mode filter. In the same manner, in a case of the polymer elastic body 213, it is preferable that the polymer elastic body 213 have elastic force corresponding to distortion of the conductive magnetic film 211 by adjusting a type, a thickness, a length, a width, and the like of the constituent materials of the polymer elastic body 213.

A metal protrusion terminal 214 may be formed on an upper side or a lower side of the polymer elastic body 213. The protrusion terminal 214 may pass through the inside of the polymer elastic body 213 to be connected with the signal line 212. Accordingly, as described above, since the end 141a of the first lead wire 141 is connected with the switching member 210, specifically, the signal line 212, a signal current applied from the first external electrode 140 may pass through the first lead wire 141, the signal line 212, the protrusion terminal 214, and the second lead wire 121 in a sequential manner to thereby flow in the coil electrode 120.

When the conductive magnetic film 211 is bent due to flowing-in of the surge current by ESD, the protrusion terminal 214 may be disconnected from the second lead wire 121, and connected with the end 161a of the third lead wire 161. Accordingly, the surge current applied from the first external electrode 140 passes through the first lead wire 141, the signal line 212, the protrusion terminal 214, and the third lead wire 161 in a sequential manner to thereby flow to the ground electrode 160.

In a different contact method between the switching member 210 and the second lead wire 121, the end 121a of the second lead wire 121 may include a terminal that protrudes to an empty space inside the ESD protection layer 200, and may be brought into contact with the switching member 210 through the terminal.

Alternatively, as described above, the protrusion terminal 214 is formed in the switching member 210, so that the end 121a of the second lead wire 121 including the terminal protruding to the empty space inside the ESD protection layer 200 may be brought into contact with the protrusion terminal 214.

Even in a contact method between the switching member 210 and the third lead wire 161, the end 161a of the third lead wire 161 including a terminal protruding to the empty space inside the ESD protection layer 200 may be brought into contact with the switching member 210. Alternatively, as described above, the protrusion terminal 214 may be formed in the switching member, so that the end 161a of the third lead wire 161 including the terminal protruding to the empty space inside the ESD protection layer 200 may be brought into contact with the protrusion terminal 214. Alternatively, even though the end 121a of the second lead wire 121 or the end 161a of the third lead wire does not include the terminal protruding to the empty space inside the ESD protection layer 200, and the protrusion terminal 213 is not formed in the switching member 210, the conductive magnetic film 211 may be sufficiently bent to thereby be brought into contact with the end 121a of the second lead wire 121 or the end 161a of the third lead wire which is exposed to the empty space inside the ESD protection layer 200.

As described above, according to the embodiments of the present invention, the common mode filter may change the inner connection structure of the filter using an electromagnetic force when a surge current is applied, instead of using an electron tunneling phenomenon of a dielectric of the related art, thereby preventing the surge current from flowing to the coil electrode in a structural manner, and improving reliability of a product.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the detailed description of the present invention does not intend to limit the present invention to the disclosed embodiments. Further, it should be appreciated that the appended claims include even another embodiment.

What is claimed is:

1. A common mode filter comprising:
   a main body that includes a coil electrode, first and second external electrodes connected with both ends of the coil electrode, respectively, and a ground electrode; and
   an ESD protection layer that includes a switching member formed therein, and is provided on any one surface of the main body,
   wherein one end of the coil electrode is connected with the second external electrode, the other end thereof is connected with the first external electrode through the switching member, and the switching member is disconnected from the coil electrode in accordance with a switching operation when a surge current is applied and connected with the ground electrode.

2. The common mode filter according to claim 1, wherein the ESD protection layer includes a permanent magnetic body that forms a magnetic field around the switching member.

3. The common mode filter according to claim 2, wherein the permanent magnetic body is disposed so as to be parallel to the switching member.

4. The common mode filter according to claim 1, wherein the switching member is provided so as to be fixed on a support portion protruding to an empty space inside the ESD protection layer.

5. The common mode filter according to claim 4, wherein the support portion is provided on each of both ends of the switching member, and the both ends of the switching member are provided so as to be fixed on the support portion, respectively.

6. The common mode filter according to claim 1, wherein the switching member includes:
   a conductive magnetic film in which distortion occurs when the surge current is applied,
   a signal line that connects both ends of the conductive magnetic film, and
   a polymer elastic body that wraps the conductive magnetic film and the signal line.

7. The common mode filter according to claim 6, wherein the switching member further includes
   a protrusion terminal that is formed on upper and lower portions of the polymer elastic body, and passes through the polymer elastic body so as to be connected with the signal line.

8. A common mode filter comprising:
   a main body that includes a coil electrode, first and second external electrodes connected with both ends of the coil electrode, and a ground electrode; and
   an ESD protection layer that includes a switching member formed therein and is provided on any one surface of the main body,
   wherein the first external electrode is connected with the switching member through a first lead wire extending from the first external electrode, one end of the coil electrode is connected with the second external electrode through a via, the other end thereof is connected with the switching member through a second lead wire extending from the other end thereof, and the switching member is disconnected from the second lead wire in accordance with a switching operation when a surge current is applied and connected with the ground electrode through a third lead wire extending from the ground electrode.

9. The common mode filter according to claim 8, wherein the ESD protection layer includes a permanent magnetic body that forms a magnetic field around the switching member.

10. The common mode filter according to claim 9, wherein the permanent magnetic body is disposed so as to be parallel to the switching member.

11. The common mode filter according to claim 8, wherein the first to third lead wires are buried in an inner wall of the ESD protection layer.

12. The common mode filter according to claim 8, wherein the switching member is provided so as to be fixed on a support portion protruding to an empty space inside the ESD protection layer.

13. The common mode filter according to claim 12, wherein the support portion is provided on each of both ends of the switching member, and the both ends of the switching member are provided so as to be fixed on the support portion, respectively.

14. The common mode filter according to claim 13, wherein an end of the first lead wire is buried in any one of the support portions that fix the both ends of the switching member to thereby be connected with the switching member.

15. The common mode filter according to claim 8, wherein the switching member includes:
    a conductive magnetic film in which distortion occurs when the surge current is applied,
    a signal line that connects both ends of the conductive magnetic film, and
    a polymer elastic body that wraps the conductive magnetic film and the signal line.

16. The common mode filter according to claim 15, wherein the switching member further includes a protrusion terminal that is formed on upper and lower portions of the polymer elastic body, and passes through the polymer elastic body so as to be connected with the signal line.

17. The common mode filter according to claim 15, wherein an end of the first lead wire is connected with the signal line.

18. The common mode filter according to claim 8, wherein an end of the second lead wire is constituted of a terminal that protrudes to an empty space inside the ESD protection layer.

19. The common mode filter according to claim 8, wherein an end of the third lead wire is constituted of a terminal that protrudes to an empty space inside the ESD protection layer.

20. The common mode filter according to claim 8, wherein the main body includes an insulating layer that buries the coil electrode, the first and second external electrodes and the ground electrode formed on the insulating layer, and a magnetic composite that is formed between the first and second external electrodes and the ground electrode.

21. The common mode filter according to claim 8, wherein the main body and the ESD protection layer, or the ESD protection layer and the main body are sequentially provided on a magnetic body substrate.

* * * * *